United States Patent
Kuriyama et al.

(10) Patent No.: US 6,741,135 B2
(45) Date of Patent: May 25, 2004

(54) RADIO FREQUENCY POWER AMPLIFIER MODULE

(75) Inventors: Akira Kuriyama, Kokubunji (JP); Masami Ohnishi, Hachioji (JP)

(73) Assignee: Renesas Technology Corporation, Tokyo (JP)

(*) Notice: Subject to any disclaimer, the term of this patent is extended or adjusted under 35 U.S.C. 154(b) by 0 days.

(21) Appl. No.: 10/315,144

(22) Filed: Dec. 10, 2002

(65) Prior Publication Data

US 2003/0117220 A1 Jun. 26, 2003

(30) Foreign Application Priority Data

Dec. 13, 2001 (JP) .................................. 2001-379960
Jul. 26, 2002 (JP) .................................. 2002-217789

(51) Int. Cl.[7] .............................................. H03F 3/04
(52) U.S. Cl. ..................... 330/302; 330/133; 330/310; 333/32
(58) Field of Search ........................ 330/302, 296, 330/285, 310, 311, 98, 133, 134; 333/32

(56) References Cited

U.S. PATENT DOCUMENTS 5,889,434 A * 3/1999 Shimura et al. ............ 330/302
5,982,236 A * 11/1999 Ishikawa et al. ........... 330/296
6,326,849 B1 * 12/2001 Wang et al. ................ 330/310

FOREIGN PATENT DOCUMENTS

JP  10-75130  8/1996

OTHER PUBLICATIONS

Nikkan Kogyo SHINBUN, "Electronic Technology", Jun. 2000, pp. 36.

* cited by examiner

Primary Examiner—Henry Choe
(74) Attorney, Agent, or Firm—Reed Smith LLP; Stanley P. Fisher, Esq.; Juan Carlos A. Marquez, Esq.

(57) ABSTRACT

An object of the present invention is to provide a radio frequency power amplifier of multi stage amplifying method that is designed to reduce instability of output power caused by electromagnetic coupling of bias supply terminals and interconnections of each stage to thereby operate stably. Another object of the present invention is to provide a radio frequency power amplifier that is designed to reduce distortion of output power caused by electromagnetic coupling of bias supply terminals and interconnections of each stage to thereby provide high efficiency. The above objects can be achieved by providing a first interconnection connected to a terminal for supplying a voltage for collector driving to a power amplifying transistor, a second interconnection connected to a terminal for supplying a voltage for collector driving to a second transistor controlling a base bias voltage of the above transistor, and one or more ground parts for electromagnetic shield, wherein the first interconnection and the second interconnection are separated by one or more of the ground parts for electromagnetic shield.

7 Claims, 11 Drawing Sheets

RADIO FREQUENCY POWER AMPLIFIER MODULE

BACKGROUND OF THE INVENTION

1. Field of the Invention

The present invention relates to a radio frequency power amplifier used in cellular phone handset, and more particularly to a voltage power supply method of reducing mutual interference between circuits through a power supply line.

2. Description of the Prior Art

Recently, there has been an increasing demand for cellular phone handset as typified by cellular phones to be more compact in size and lighter in weight, and therefore research and development is being vigorously made to satisfy the demand. Conventional power amplifying circuits for transmission used in cellular phone handset require negative voltage power supply or negative voltage power creation circuit, have many part configurations, and cannot therefore meet the demand of being compact in size and light in weight. Accordingly, heterojunction bipolar transistors of Gallium Arsenide compound semiconductor (hereinafter simply referred to as GaAsHBT) are expected as amplifying devices used in radio frequency power amplifiers for transmission because they are capable of single positive voltage power supply and have excellent radio frequency characteristics.

FIG. 12 shows a conventional radio frequency power amplifier employing GaAsHBT, disclosed in Japanese Patent Laid-Open No. H10-75130. The radio frequency power amplifier comprises: an input impedance matching circuit 401; a power amplifying transistor 410; an output impedance matching circuit 402; and a base bias voltage control circuit 403 for the power amplifying transistor 410. The base bias voltage control circuit 403 comprises a transistor 411 and resistors 420 and 421. The reference numeral 430 denotes power supply for driving the collectors of the transistors 410 and 411, and the reference numeral 431 denotes power supply for controlling the gain of the radio frequency power amplifier, which is applied to the base of the power amplifying transistor through the base bias voltage control circuit. The base bias voltage control circuit, by substantially supplying a base current Ibb of the power amplifying transistor from the power supply for collector driving, is generally used to reduce a current Iapc for gain control to be supplied from the power supply for gain control and thereby reduce current supply capacity demanded to external control circuits to generate a voltage for gain control.

With saturation amplifiers complying with the GSM (Global System for Mobile Communication) system widely used principally in Europe presently, a trade-off relationship between output power and power added efficiency is a major problem in the development of radio frequency power amplifiers.

Moreover, with linear amplifiers complying with the W-CDMA (Wideband Code Division Multiple Access) system, which is one of third generation mobile communication systems, in addition to the trade-off between output power and power added efficiency, a trade-off relationship exists between distortion and power added efficiency, as described in page 36 in "Electronic Technology June, 2000" published by Nikkan Kogyo Shinbun.

Therefore, in the linear amplifiers, reduction in distortion leads to an increase in power added efficiency of radio frequency power amplifiers, which, in turn, leads to an increase in the performance of the radio frequency power amplifiers.

SUMMARY OF THE INVENTION

In the above conventional radio frequency power amplifier, the power supply for driving the collector of the transistor making up the base bias voltage control circuit is shared with the power supply for driving the collector of the power amplifying transistor. The above conventional radio frequency power amplifier has no capacitor enough to cut off a high frequency leakage signal of the collector current Icc due to output power of the power amplifying transistor, e.g., capacitor enough to couple a collector line and the ground. Consequently, the high frequency leakage signal of the collector current Icc is fed back to the base current Ibb of the power amplifying transistor through the base bias voltage control circuit, causing the radio frequency power amplifier to operate unstably.

Moreover, the high frequency leakage signal of the collector current Icc is fed back to the base current Ibb of the power amplifying transistor through the base bias voltage control circuit, causing an increase in distortion in the output power of the radio frequency power amplifier.

An object of the present invention is to provide a radio frequency power amplifier of multi stage amplifying method that is designed to reduce instability of output power caused by electromagnetic coupling of bias supply terminals and inter lines of each stage to thereby operate stably. Another object of the present invention is to provide a radio frequency power amplifier of multi stage amplifying method that is designed to reduce distortion of output power caused by electromagnetic coupling of bias supply terminals and inter lines of each stage to thereby provide high efficiency characteristics.

The above objects can be achieved by providing the radio frequency power amplifier of the claims 1 to 7 with the first terminal for supplying a voltage for collector driving to the first transistor for power amplification, the second terminal for supplying a voltage for collector driving to a second transistor controlling a base bias voltage of the first transistor, the first interconnection for connecting the first terminal and the collector of the first transistor, the second interconnection for connecting the second terminal and the collector of the second transistor, and one or more ground parts for electromagnetic shield, wherein the first terminal and the second terminal are separated by one or more of the ground parts for electromagnetic shield, and the first interconnection and the second interconnection are separated by one or more of the ground parts for electromagnetic shield.

DETAILED DESCRIPTION OF THE PREFERRED EMBODIMENTS

Hereinafter, the present invention will be described in more detail, using preferred embodiments. The accompanying drawings are used in the description to ease understanding of the present invention.

<First Embodiment>

Figure 1:
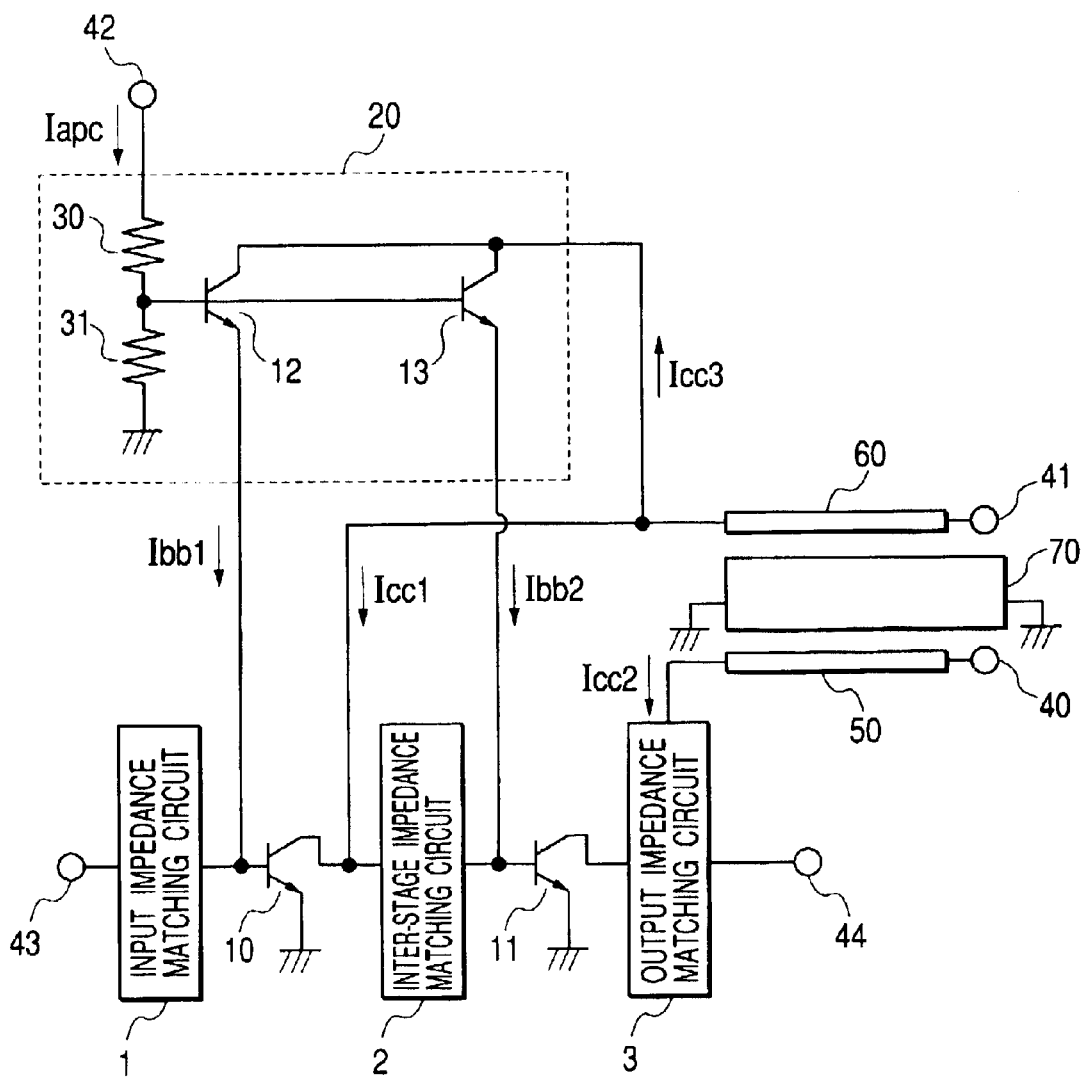
FIG. 1 is a circuit diagram of a radio frequency power amplifier module implementing first and second embodiments of the present invention.

FIG. 1 shows a configuration of a radio frequency power amplifier circuit in a first embodiment. The radio frequency power amplifier circuit comprises: an input impedance matching circuit 1; an input stage transistor 10 for power amplification; an inter-stage impedance matching circuit 2; an output stage transistor 11 for power amplifier; an output impedance matching circuit 3; and a base bias voltage control circuit 20 for transistors 10 and 11, wherein the base bias voltage control circuit 20 in this circuit comprises the transistors 12 and 13 and resistors 30 and 31. The radio frequency power amplifier circuit comprises: a first terminal 40 for supplying a voltage for collector driving to the output stage transistor 11; a second terminal 41 for supplying a voltage for collector driving to the transistors 12 and 13 making up the base bias voltage control circuit 20; a third terminal 42 for supplying a current and a voltage for gain control to the transistors 12 and 13 making up the base bias voltage control circuit 20; a signal input terminal 43 for inputting a signal to the base of the input stage transistor 10; a signal output terminal 44 for extracting a signal from the collector of the output stage transistor 11 through the output impedance matching circuit 3; a first interconnection 50 for connecting the first terminal 40 and the collector of the output stage transistor 11 through the output impedance matching circuit 3; a second interconnection 60 for connecting the second terminal 41 and the collectors of the transistors 11 and 12 making up the base bias voltage control circuit; and a ground metal side (hereinafter referred to as a ground part for electromagnetic shield) 70. Furthermore, the first terminal 40 and the second terminal 41 are separated from each other by one or more of the ground part 70 for electromagnetic shield, and the first interconnection 50 and the second interconnection 60 are also separated from each other by one or more of the ground part 70 for electromagnetic shield. The ground part 70 for electromagnetic shield comprises a conductive film and is formed on a dielectric plate, for example, by a metal evaporating method or sputtering method. It may also be formed by coating a dielectric material on a dielectric plate. A material such as metal may be used.

Figure 2:
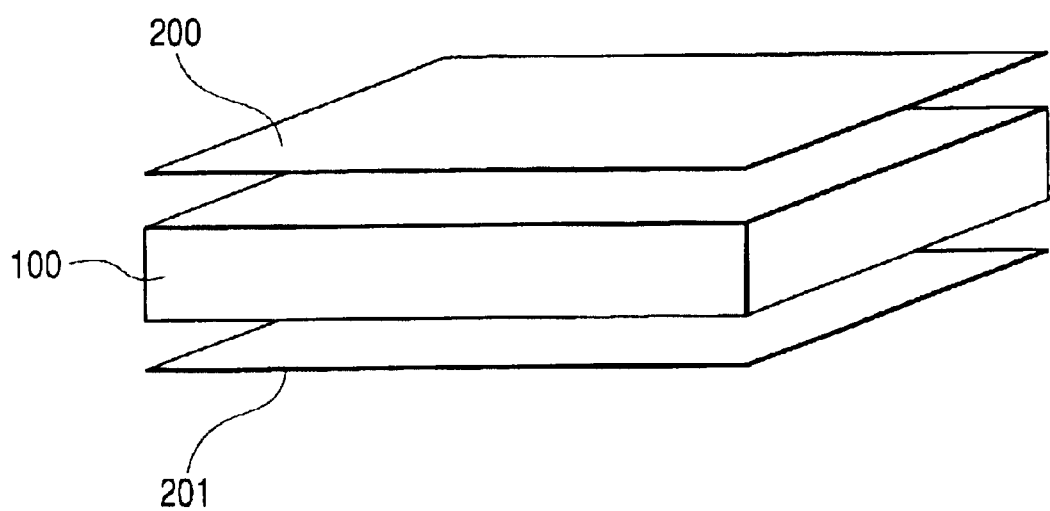
FIG. 2 is a diagram of substrate layer configuration in the first embodiment of the present invention.

FIG. 2 shows a configuration of a module (substrate layer) embodying the circuit of FIG. 1. The substrate comprises a front-side conductive layer 200; a back-side conductive layer 201; and a dielectric plate 100. The conductive layers are primarily made of, e.g., copper and gold, and the dielectric plate is primarily made of, e.g., ceramic and resin.

Figure 3:
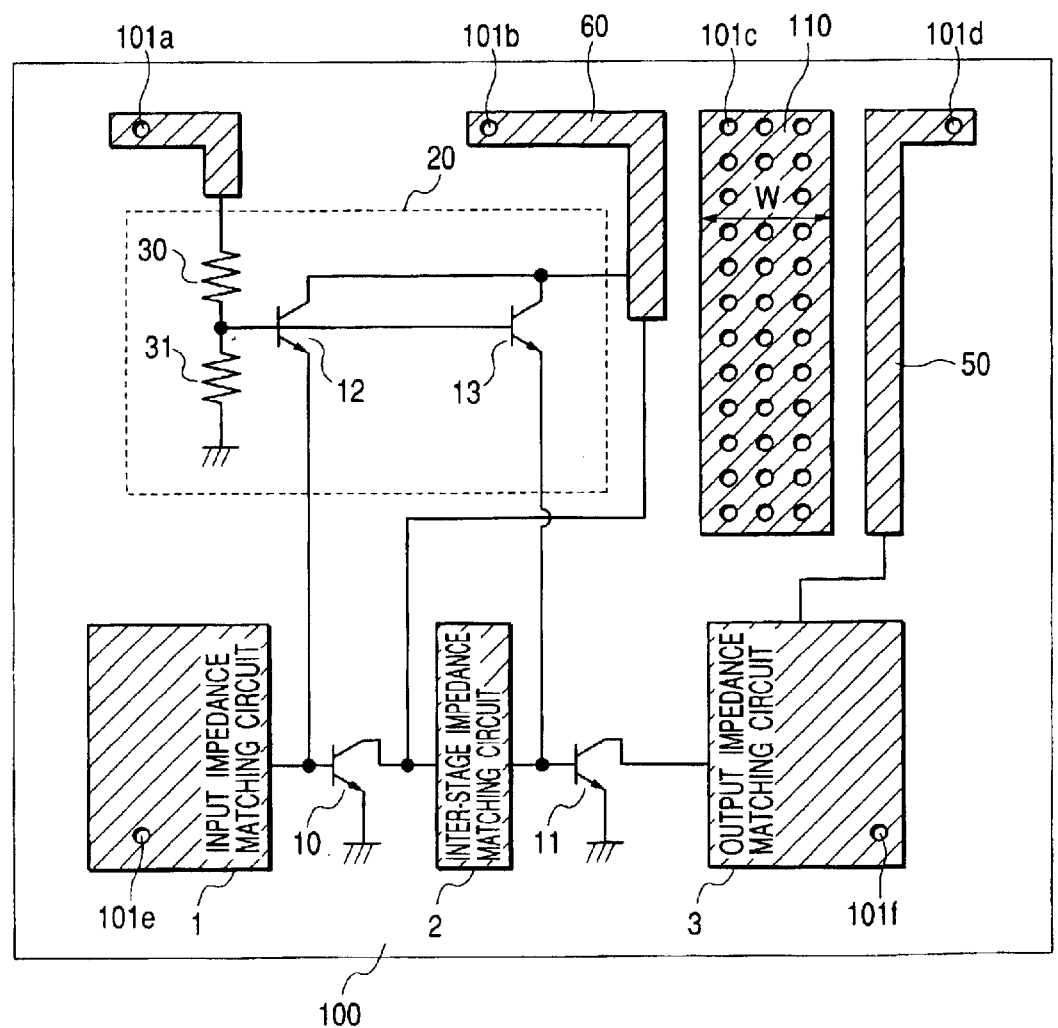
FIG. 3 is a schematic diagram of a front-side conductive layer in the first embodiment of the present invention.
Figure 4:
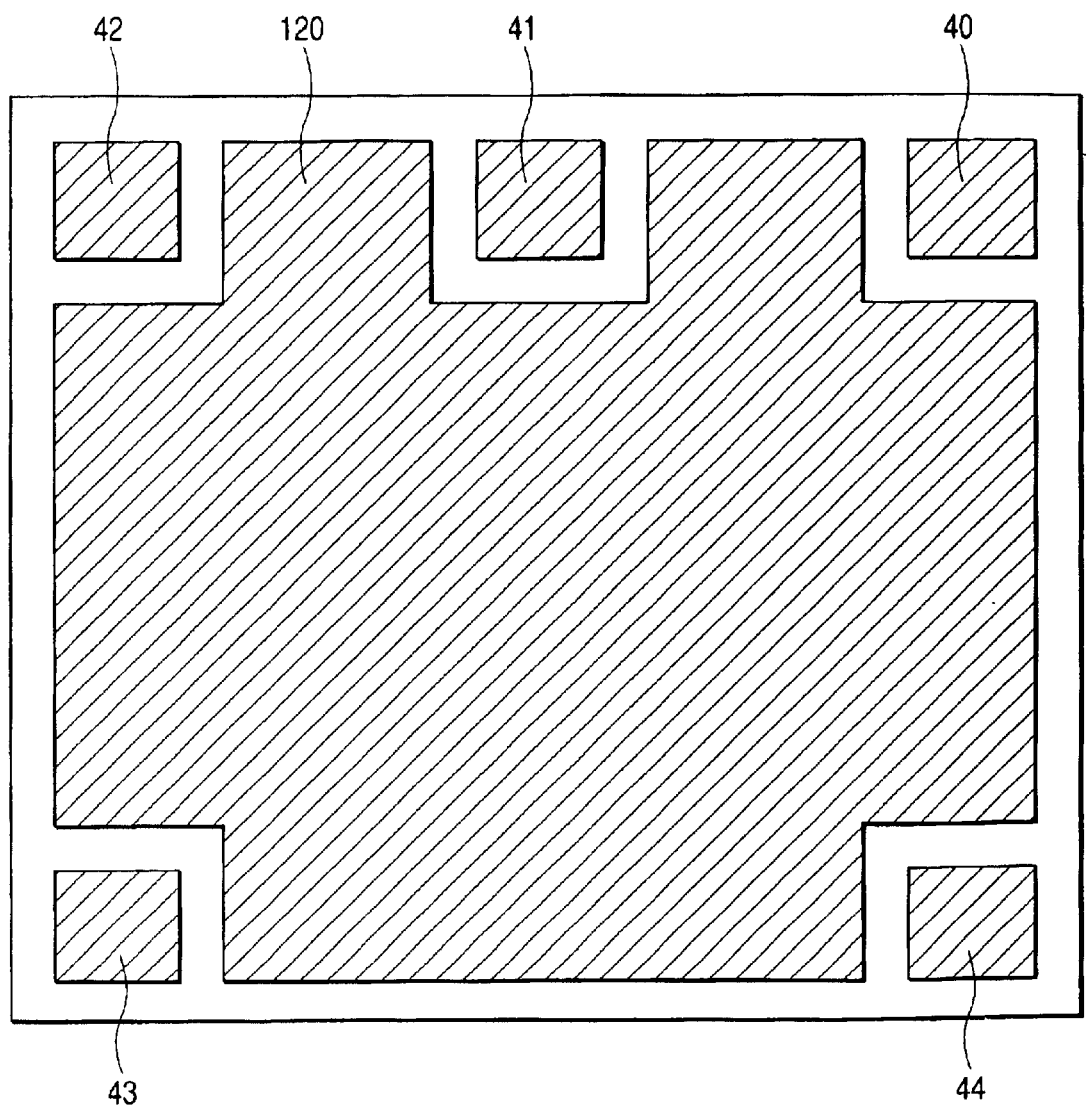
FIG. 4 is a schematic diagram of a back-side conductive layer in the first embodiment of the present invention.
Figure 5:
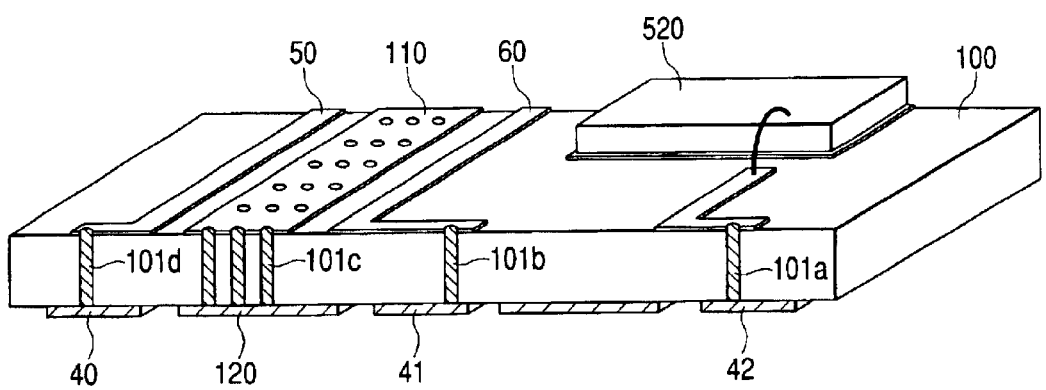
FIG. 5 is a perspective view of major portions in the first embodiment of the present invention.

FIG. 3 shows a schematic diagram of the front-side conductive layer 200, FIG. 4 shows a schematic diagram of the back-side conductive layer 201, and FIG. 5 shows a perspective view of major portions.

In FIG. 3, the reference numeral 1 denotes the input impedance matching circuit; 2, the inter-stage impedance matching circuit; 3, the output impedance matching circuit; 10, the input stage transistor; 11, the output stage transistor; 20, the base bias voltage control circuit of the power amplifying transistors 10 and 11; 12 and 13, transistors making up the base bias voltage control circuit; 30 and 31, resistors of the base bias voltage control circuit; 50, the first interconnection; 60, the second interconnection; 110, a first ground part for electromagnetic shield separating the first interconnection 50 and the second interconnection 60; 100, a dielectric plate; and 101a to 101f, through holes connecting the conductive layers as shown in FIG. 5.

The power amplifying transistors 10 and 11, and the base bias voltage control circuit 20 are formed on an identical or discrete semiconductor device, and mounted on the front-side conductive layer. Particularly, the power amplifying transistors 10 and 11 are formed on a semiconductor device primarily made of GaAs.

In FIG. 4, 40 denotes the first terminal; 41, the second terminal; 42, the third terminal; 43, the signal input terminal; 44, the signal output terminal; and 120, a second ground part for electromagnetic shield separating the first terminal 40 and the second terminal 41.

In FIG. 5, 520 denotes a semiconductor device mounting the base bias voltage control circuit 20.

The present invention has a module structure as shown in FIGS. 3 to 5. Hereinafter, embodiments of the module configuration will be described. The base of the input stage transistor 10 is connected to the signal input terminal 43 through the input impedance matching circuit 1 and a through hole 101e. The collector of the output stage transistor 11 is connected to the signal output terminal 44 through the output impedance matching circuit 3 and a through hole 101f, and connected to the first terminal 40 through the output impedance matching circuit 3, the first interconnection 50, and a through hole 101d. The bases of the transistors 12 and 13 making up the base bias voltage control circuit are connected to the third terminal 42 through a through hole 101a. The collectors of the transistors 12 and 13 are connected to the second terminal 41 through the second interconnection 60 and a through hole 101b. The first ground part 110 for electromagnetic shield is connected to the second ground part 120 for electromagnetic shield through one or more through hole(s) 101c, and the second ground part 120 for electromagnetic shield is grounded on a motherboard.

The operation of a first embodiment of the radio frequency power amplifier of the present invention will be described using the drawings.

In FIG. 1, a signal inputted from the signal input terminal 43 is extracted from the signal output terminal 44 through the input impedance matching circuit 1, the input stage transistor 10, the inter-stage impedance matching circuit 2, the output stage transistor 11, and the output impedance matching circuit 3. The base bias voltage control circuit 20, by substantially supplying base currents Ibb1 and Ibb2 of the power amplifying transistors 10 and 11 from a collector current Icc3 from the second terminal 41, is used to reduce a current Iapc for gain control to be supplied from the power supply for gain control and thereby reduce current supply capacity demanded to external control circuits to generate a voltage for gain control. For example, by using the transistor 12 to drive the base of the input stage transistor 10, a reduction amount of the current Iapc for gain control to be supplied from the power supply for gain control is substantially inversely proportional to an amplification rate of the transistor 12 for base driving. Since a current amplification rate of transistors is normally 10 or more, a current required can be reduced at least one tenth in comparison with cases where the transistor 12 for base driving is not used. As a result, at least 90 percent or more of the current Ibb1 for driving the base of the first stage transistor for power amplification can be obtained by amplifying the collector current Icc. This is also true for the operation of the transistor 13 for driving the base of the output stage transistor 11.

Figure 11:
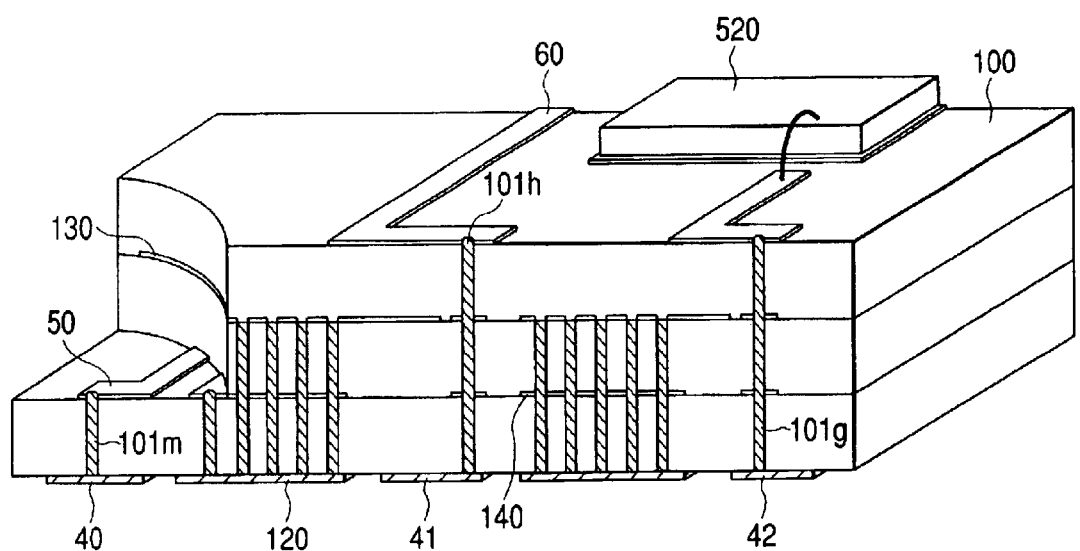
FIG. 11 is a perspective view of major portions in the second embodiment of the present invention.
Figure 12:
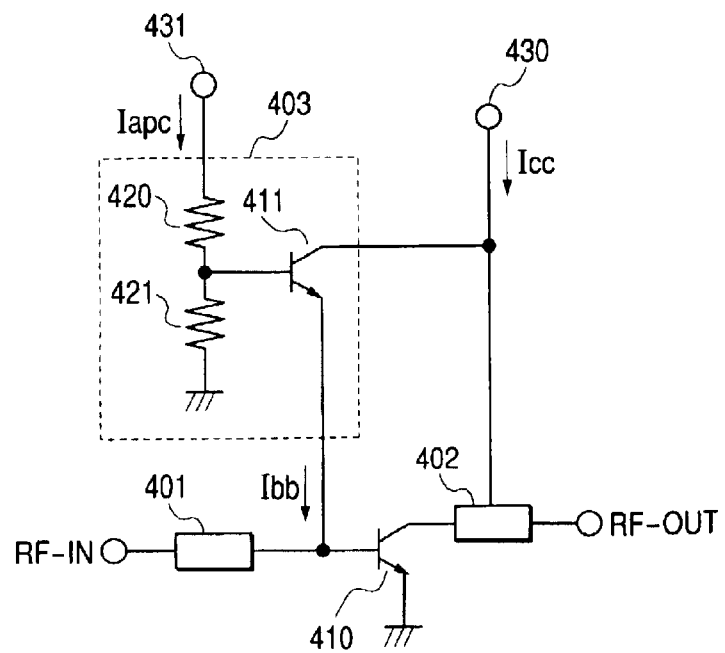
FIG. 12 is a circuit diagram of a conventional radio frequency power amplifier.

In FIGS. 1, 5, and 11, the ground parts 70, 110, 130, and 140 for electromagnetic shield are grounded to the second ground part 120 for electromagnetic shield through one or more through hole(s), and the second ground part 120 for electromagnetic shield is grounded to the motherboard or the like. Because of this construction, all the ground parts 70, 110, 120, 130, and 140 for electromagnetic shield become zero voltage. Assume that the radio frequency power amplifier of the present invention is activated at a frequency of 900 MHz with a power supply voltage of 3.5 V, and output power of the output stage transistor 11 is 35 dBm. At this time, voltage amplitude in the collector of the output stage transistor 11 becomes about 15 V, and current and voltage of the first interconnection 50 leak due to influence of the high frequency output power. Normally, for the power supply line formed on the motherboard or the like so as to electrically connect to the power supply for collector driving and the first and second terminals mounted on the module, a capacitive device of several $\mu F$ is inserted between the power supply line and the ground so that the high frequency leakage signal does not propagate to the power supply for collector driving or other power supply lines.

However, the substrate is small in size, and a capacitive device is generally placed between the line for supplying a voltage for driving the collectors of the input stage transistor 10 and the output stage transistor 11 that are formed on the module, and the ground to minimize influence of the line for supplying a voltage for driving the collectors on a high frequency circuit system (not shown). However, the capacitive device of several $\mu F$ used for the motherboard or the like is large in part size and difficult to use, and actually has a capacity of equal to or less than 100 nF. Accordingly, high frequency leakage signals of current and voltage of the first interconnection 50 propagate to the base bias voltage control circuit 20 through the second interconnection 60.

Figure 6:
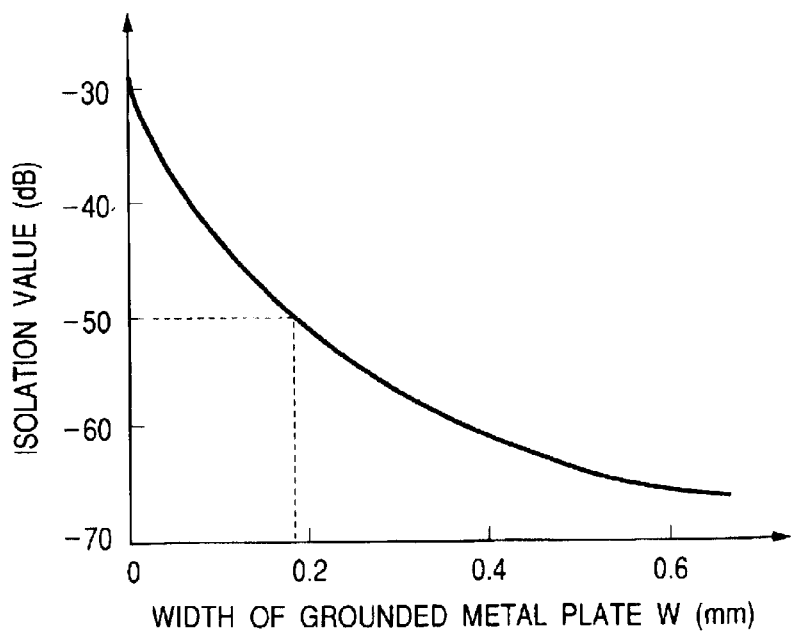
FIG. 6 is a diagram showing a relationship between the width of a ground part for electromagnetic shield and inter-circuit isolation in an embodiment of the present invention.

FIG. 6 shows results of three dimensional electromagnetic simulation when an alumina ceramic substrate is used as a dielectric plate. FIG. 6 shows a relationship between the width of the first ground part (or ground metal side) 110 for electromagnetic shield inserted between the first interconnection 50 and the second interconnection 60, and isolation values between the first interconnection 50 and the second interconnection 60.

In the above simulation, the interval between the first interconnection 50 and the first ground part 110 for electromagnetic shield, and the interval between the second interconnection 60 and the first ground part 110 for electromagnetic shield are fixed to 0.1 mm, a minimum dimension generally used to fabricate high frequency modules.

It is understood from FIG. 6 that, when the first ground part for electromagnetic shield is absent, an isolation value is about −30 dB, which is insufficient for the output voltage 35 dBm. Accordingly, as described in the operation of the base bias voltage control circuit, since the base current Ibb2 of the output stage transistor 11 is substantially supplied from the collector current Icc3 of the fourth transistor 13 through the second interconnection 60 from the second terminal 41, a high frequency leakage signal generated in the second interconnection 60 propagates to the base current Ibb2 of the output stage transistor 11. When the base current suffers a high frequency leakage signal, the transistor generally becomes unstable in operation, so that the operation of the radio frequency power amplifier becomes unstable.

However, the radio frequency power amplifier, as described above, is provided with the first terminal 40 and first interconnection 50 for supplying a voltage for collector driving to the output stage transistor for power amplification, and the second terminal 41 and second interconnection 60 for supplying voltages for collector driving to the transistors 12 and 13 making up the base bias voltage control circuit, and further includes the first ground part 110 for electromagnetic shield provided between the first interconnection 50 and the second interconnection 60, and the second ground part 120 for electromagnetic shield provided between the first interconnection 40 and the second interconnection 41. By forming the first ground part 110 for electromagnetic shield and the second ground part 120 for electromagnetic shield so that their width is 0.2 mm or more, an isolation value of −50 dB or less can be obtained.

With this construction, since the current and voltage high frequency leakage signals neither propagate from the first interconnection 50 to the second interconnection 60 nor from the first terminal 40 to the second terminal 41, the base currents Ibb1 and Ibb2 of the power amplifying transistors 10 and 11 making up the radio frequency power amplifier are stabilized and the operation of the power amplifying transistors 10 and 11 is stabilized, so that the above problem can be solved.

<Second Embodiment>

Hereinafter, a second embodiment of the present invention will be described using the drawings. The circuit configuration of a radio frequency power amplifier in a second embodiment is the same as that in FIG. 1 used in the first embodiment.

Figure 7:
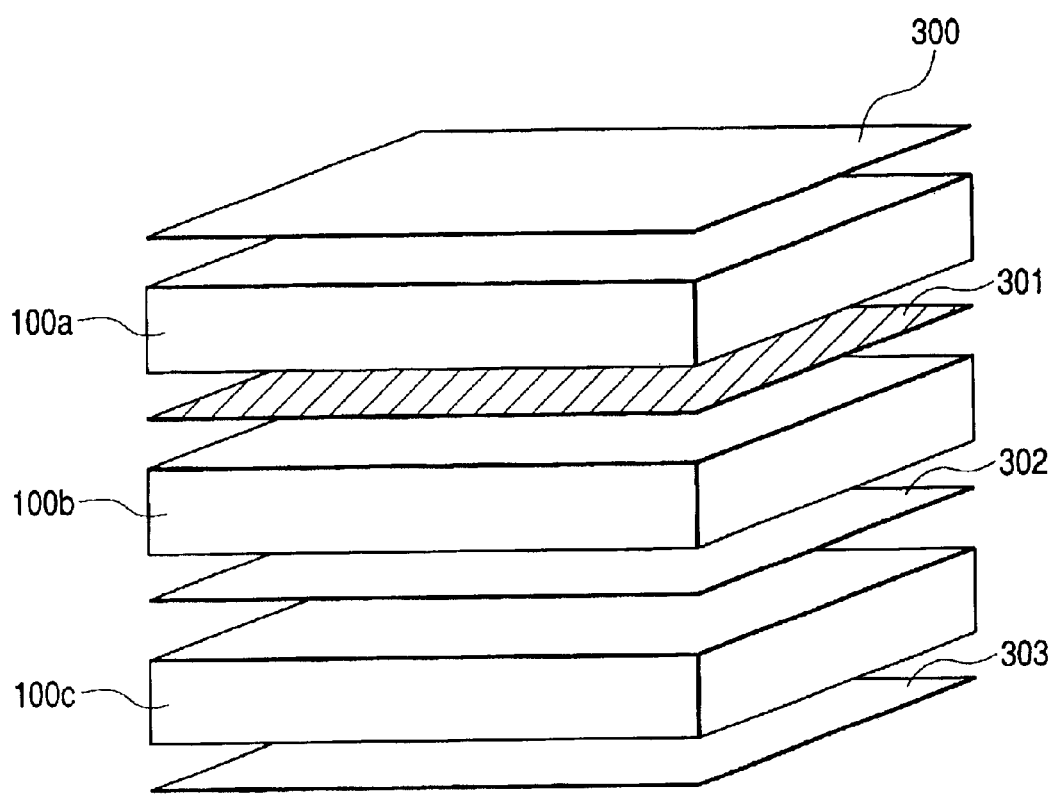
FIG. 7 is a schematic diagram of substrate layer configuration in the second embodiment of the present invention.

FIG. 7 shows the configuration of a module (substrate layer) in the second embodiment. The substrate comprises: a front-side conductive layer 300; a first inner conductive layer 301; a second inner conductive layer 302; a back-side conductive layer 303; and dielectric plates 100a, 100b, and 100c. Components of the conductive layers and the dielectric plates are the same as those in the first embodiment.

Figure 8:
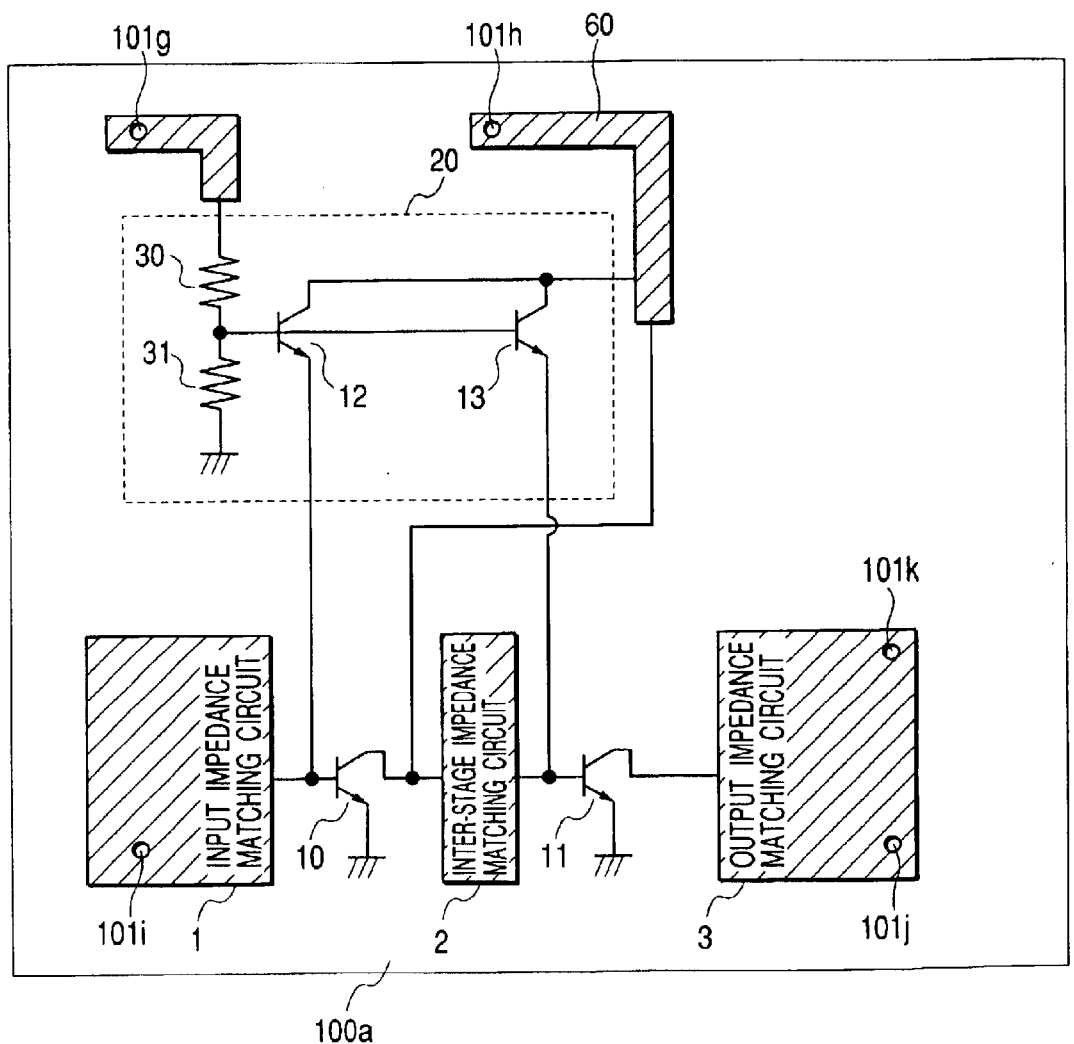
FIG. 8 is a schematic diagram of a front-side conductive layer in the second embodiment of the present invention.
Figure 9:
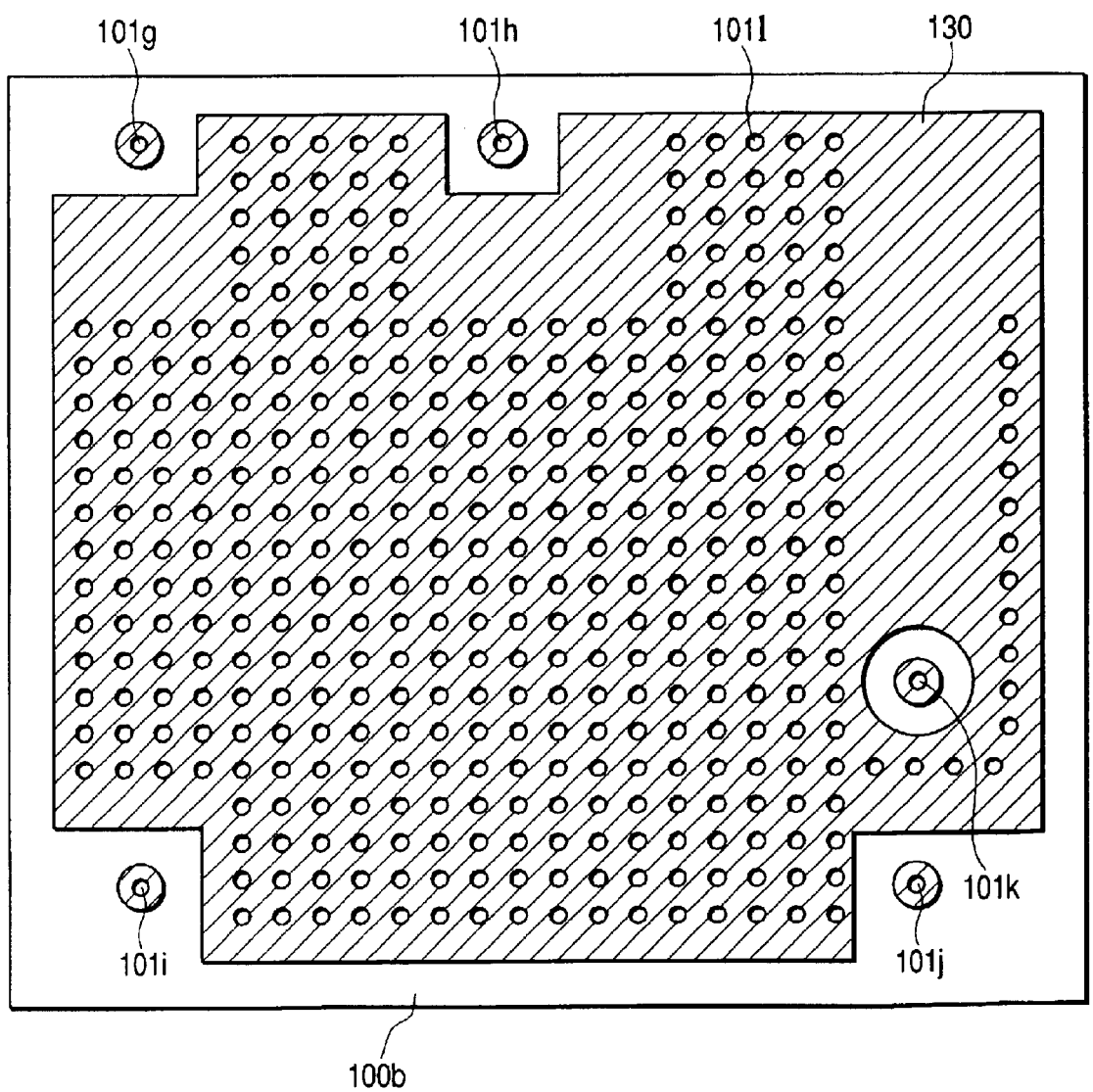
FIG. 9 is a schematic diagram of a first inner conductive layer in the second embodiment of the present invention.
Figure 10:
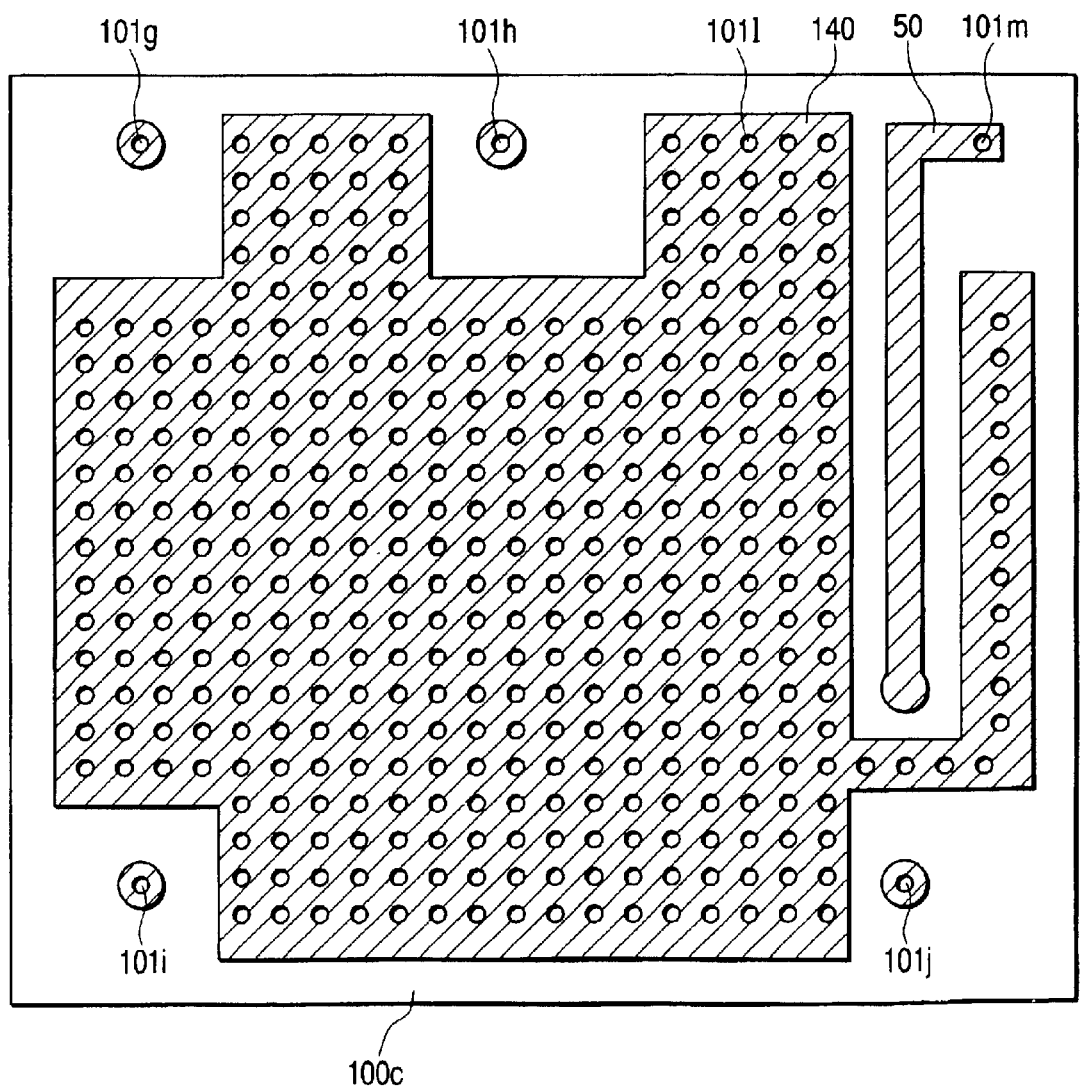
FIG. 10 is a schematic diagram of a second inner conductive layer in the second embodiment of the present invention.

FIG. 8 shows a schematic diagram of the front-side conductive layer 300, FIG. 9 shows a schematic diagram of the first inner conductive layer 301, FIG. 10 shows a schematic diagram of the second inner conductive layer 302, and FIG. 11 shows a perspective view of major portions. In the second embodiment, a schematic diagram of the back-side conductive layer 303 is the same as that in FIG. 4 used in the first embodiment.

In FIG. 8, the structures of an input impedance matching circuit 1, input stage transistor 10 for power amplification, inter-stage impedance matching circuit 2, output stage transistor 11 for power amplifier, output impedance matching circuit 3, base bias voltage control circuit 20, and transistors 12 and 13 and resistors 30 and 31 making up the base bias voltage control circuit 20 are the same as those in the first embodiment.

FIG. 9 shows a schematic diagram of the inner conductive layer 301 of FIG. 7. The reference numeral 130 denotes a third ground part for electromagnetic shield.

In FIG. 10, the reference numeral 50 denotes the first interconnection and 140 denotes a fourth ground part for electromagnetic shield.

As shown in FIGS. 8 to 11, the base of the input stage transistor 10 is connected to the signal input terminal 43 through the input impedance matching circuit 1 and the through hole 101$i$, and the collector of the output stage transistor 11 is connected to the signal output terminal 44 through the output impedance matching circuit 3 and the through hole 101$j$.

At the same time, the collector of the output stage transistor 11 is connected to the first terminal 40 through a through hole 101$k$ for connecting the output impedance matching circuit 3, the front-side conductive layer 300, and the second inner conductive layer 302, and a through hole 101$m$ for connecting the first interconnection 50 formed on the second inner conductive layer 302, the second inner conductive layer 302, and the back-side conductive layer 303. The bases of the transistors 12 and 13 making up the base bias voltage control circuit are connected to the third terminal through a through hole 101$g$, and the collectors of the transistors 12 and 13 are connected to the second terminal 41 through a through hole 101$h$ for connecting the second interconnection 60, the front-side conductive layer 300, and the back-side conductive layer 303.

The third and fourth ground parts 130 and 140 for electromagnetic shield are connected to the second ground part 120 for electromagnetic shield formed on the back-side conductive layer 303 through one or more through hole(s) 1011, and the second ground part 120 for electromagnetic shield is grounded to the motherboard or the like.

The third ground part 130 for electromagnetic shield has a width equal to or greater than W1+2×W2, where W1 is the width of the first interconnection 50 and W2 is dielectric plate thickness.

This is a result derived from the three dimensional electromagnetic simulation, based on the fact that the intensity of electromagnetic field to the third ground part for electromagnetic shield from the first interconnection is the strongest within an angle of 45 degrees from the end of the first interconnection and becomes weaker for greater angles.

The radio frequency power amplifier of the present invention shown in the second embodiment has the first inner conductive layer 301 comprising mainly the third ground part for electromagnetic shield between conductive layers having the first interconnection 50 and the second interconnection 60, respectively.

Although, in the second embodiment, the first interconnection 50 is formed on the second inner conductive layer 302 and the second interconnection 60 is formed on the front-side conductive layer 300, the first interconnection 50 may be formed on the front-side conductive layer 300 and the second interconnection 60 may be formed on the second inner conductive layer 302.

The first interconnection 50 and the second interconnection 60 may extend to plural conductive layers. An example of this is described using FIGS. 7 and 13.

Figure 13:
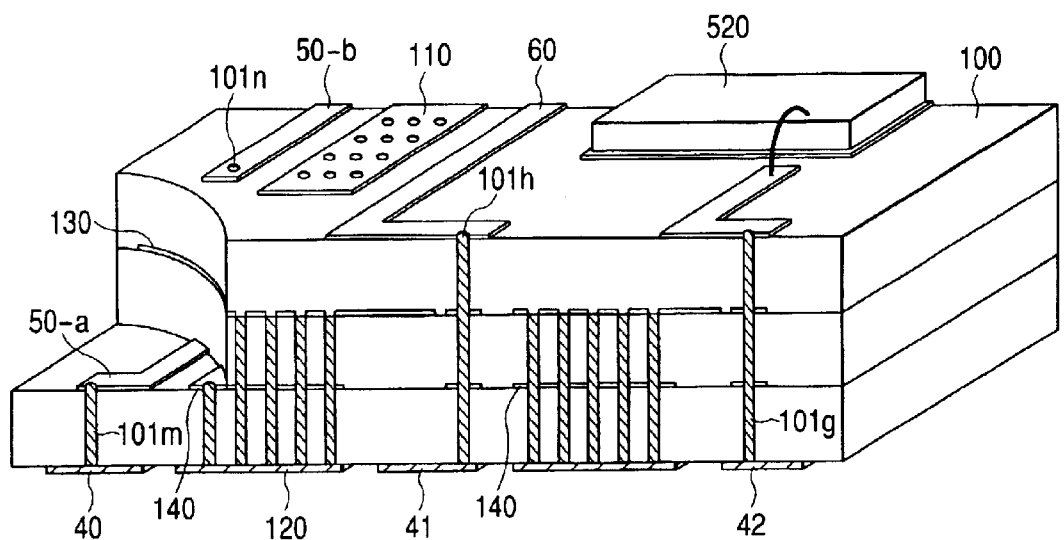
FIG. 13 is a perspective view of major portions of a radio frequency power amplifier of the present invention.

In FIG. 13, the reference numeral 40 denotes a first terminal formed on the back-side conductive layer 303 (see FIG. 7); 50-$a$, part of the first interconnection 50 formed on the second inner conductive layer 302; 50-$b$, part of the first interconnection 50 formed on the front-side conductive layer 300; 101$m$, a through hole for connecting the first terminal 40 and the first interconnection 50-$a$; 101$n$, a through hole for connecting the first interconnection 50-$a$ and the first interconnection 50-$b$; 41, a second terminal formed on the back-side conductive layer 303; 60, a second interconnection formed on the front-side conductive layer; and 101$h$, a through hole for connecting the second terminal 41 and the second interconnection 60. The first ground part 110 for electromagnetic shield is formed between the first interconnection 50-$b$ and the second interconnection 60. The third ground part 130 for electromagnetic shield formed on the first inner conductive layer 301 is disposed between the first interconnection 50-$a$ and the second interconnection 60. In the second inner conductive layer, the fourth ground part 140 for electromagnetic shield is formed between the first interconnection 50-$a$ and the through hole 101$h$. In this way, the methods of the first and second embodiments may be mixed as required.

Although, in the second embodiment, the input impedance matching circuit 1, the inter-stage impedance matching circuit 2, and the output impedance matching circuit 3 are formed on the front-side conductive layer 300, they may be formed dispersedly on the front-side conductive layer 300 and the second inner conductive layer 302.

The operation of the present invention in the second embodiment is the same as that in the first embodiment.

Although, in the first and second embodiments, a back-side electrode system of fabricating terminals on a back-side conductive layer is adopted, a side electrode system of fabricating the terminals at the sides of a substrate may be adopted. Although, in the first and second embodiments, two-stage amplifiers are used, one-stage amplifiers or three-or-more stage amplifiers may be used.

In the first and second embodiments, the second terminal 41 is shared as a terminal for supplying a voltage for collector driving to the transistors 12 and 13 making up the base bias voltage control circuit and a terminal for supplying a voltage for collector driving to the power amplifying transistor 10. However, the second terminal 41 may be formed separately to a fourth terminal for supplying a voltage for collector driving to the transistors 12 and 13 making up the base bias voltage control circuit and a fifth terminal for supplying a voltage for collector driving to the power amplifying transistor 10.

Although, in the first and second embodiments, the transistors making up the power amplifying circuit use GaAsHBT, it goes without saying that the present invention is not limited to this substance and numerous variations may be used. For example, HBT using SiGe (silicon germanium) and HBT using InP (indium phosphide) are applicable.

Although, in the first and second embodiments, the transistors making up the power amplifying circuit are bipolar transistors, the present invention is not limited to the bipolar transistors. For example, MOSFET (field-effect transistors) is applicable as the above transistors. In this case, although the above circuit operation is different for current driven types and voltage driven types, a radio frequency power amplifier operating stably, which is an object of the present invention, can be obtained.

Although, in the first and second embodiments, emitter follower is used as the circuit form of the base bias voltage control circuit 20, the present invention is not limited to this form, and any forms such as source follower and voltage follower using an operational amplifier may be employed.

In the first and second embodiments, a ground part for electromagnetic shield is disposed between the first interconnection 50 connecting the collector of the transistor 11 and the first terminal 40 for supplying a voltage for collector driving to the transistor 11 through the output impedance matching circuit 3, and the second interconnection 60 connecting the collectors of the transistors 12 and 13 and the second terminal 41 for supplying a voltage for collector driving to the transistors 12 and 13.

In FIG. 11, the ground parts 130 and 140 for electromagnetic shield are grounded to the second ground part 120 for electromagnetic shield through one or more through hole(s), and the second ground part 120 for electromagnetic shield is grounded to the motherboard or the like. Because of this construction, all the ground parts 120, 130, and 140 for electromagnetic shield become zero voltage. Assume that the radio frequency power amplifier of the present invention is activated at a frequency of 900 MHz with a power supply voltage of 3.5 V, and output power of the output stage transistor 11 is 35 dBm.

At this time, voltage amplitude in the collector of the output stage transistor 11 becomes about 15 V, and current and voltage of the first interconnection 50 leak due to influence of the high frequency output power. Normally, for the power supply line formed on the motherboard or the like so as to electrically connect to the power supply for collector driving and the first and second terminals mounted on the module, a capacitive device of several $\mu$F is inserted between the power supply line and the ground so that the high frequency leakage signal does not propagate to the power supply for collector driving or other power supply lines.

However, as described as to the operation of the first and second embodiments, an object of the present invention is to prevent propagation of an electromagnetic leakage signal from the first interconnection 50 supplying a voltage for collector driving to the power amplifying transistor 11 to the input side of the transistor 11 and thereby stabilize output power of the power amplifier.

Accordingly, it is desirable that ground parts for electromagnetic shield are disposed not only between the first interconnection 50 and the second interconnection 60, but also between the first interconnection 50 and a third interconnection (not shown) connecting the base of the transistor 10 and the emitter of the transistor 12, between the first interconnection 50 and a fourth interconnection (not shown) connecting the base of the transistor 11 and the emitter of the transistor 13, and between the first interconnection 50 and a fifth interconnection (not shown) connecting the collector of the transistor 10 and the second terminal 41, respectively.

Figure 14:
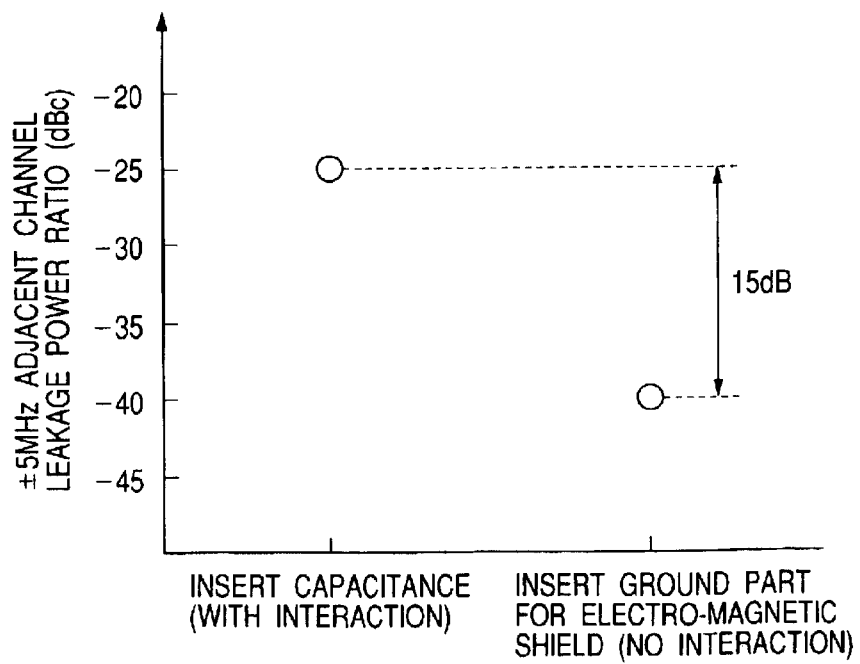
FIG. 14 is a diagram showing actual measurement values of output voltage distortion of a linear amplifier.

FIG. 14 shows actual measurement values of ±5 MHz adjacent channel leakage power ratio in a state in which a capacitive device is inserted between the first interconnection 50 and the fourth interconnection and there is electromagnetic interaction between the first interconnection and the fourth interconnection, and in a state in which a ground part for electromagnetic shield is inserted between the first interconnection and the fourth interconnection and there is no electromagnetic interaction between the first interconnection and the fourth interconnection. The adjacent channel leakage power ratio is generally used as a parameter indicating the distortion of output power of a power amplifier to input power. Measurement conditions are room temperature, W-CDMA modulation signal input, input signal frequency 1.95 GHz, and output power 27 dBm.

It is understood from FIG. 14 that distortion is reduced by about 15 db by inserting a ground part for electromagnetic shield between the first interconnection and the fourth interconnection. Accordingly, applying the radio frequency power amplifier of the first and second embodiments to a linear amplifier reduces an adjacent channel leakage power ratio.

Although W-CDMA modulation is exemplified in the above embodiment, it goes without saying that the same effects can also be obtained in application to radio frequency power amplifiers used in modulation systems requiring linear amplifiers such as general CDMA modulation, EDGE (Enhanced Data-rate for GSM Evolution), PDC (Personal Digital Cellular) and OFDM (Orthogonal Frequency Division Multiplexing).

According to the present invention, high frequency leakage signals in currents and voltages of a power supply line for driving in a radio frequency power amplifier are suppressed and the operation of the radio frequency power amplifier can be stabilized. Moreover, if the radio frequency power amplifier of the present invention is applied to a linear amplifier, the distortion of output power to input power can be reduced with the effect that the efficiency of the radio frequency power amplifier can be increased.

What is claimed is:

1. A radio frequency power amplifier module comprising:
   a first transistor for amplifying and outputting a signal inputted through an input or inter-stage impedance matching circuit;
   a second transistor for driving the first transistor;
   a first terminal for supplying a driving voltage to the first transistor;
   a first interconnection for connecting the first terminal and an output terminal of the first transistor;
   a second terminal for supplying a driving voltage to an output terminal of the second transistor;
   a second interconnection for connecting the second terminal and the output terminal of the second transistor; and
   a ground part for electromagnetic shield provided between the first and second interconnections.

2. The radio frequency power amplifier module according to claim 1, comprising:
   the first interconnection and the second interconnection each comprising a conductive layer mounted on a main front side of a dielectric plate, disposed to be at least partially opposite to each other;
   a first ground part for electromagnetic shield comprising a conductive layer provided in an area in which the first and second interconnections are opposite to each other, not in contact with the interconnections;
   a second ground part for electromagnetic shield comprising a conductive layer provided on a back side of the dielectric plate; and
   one or more through hole(s), provided on the dielectric plate, for electrically connecting the first ground part for electromagnetic shield and the second ground part for electromagnetic shield.

3. The radio frequency power amplifier module according to claim 2, wherein the first ground part for electromagnetic shield has a width of 0.2 mm or more.

4. The radio frequency power amplifier module according to claim 1, comprising:
   a first dielectric layer having a first surface on which the first interconnection is formed;
   a second dielectric layer having a first surface on which the second interconnection is formed;
   a third dielectric layer having a first ground part for electromagnetic shield formed on a first surface thereof, disposed between the first dielectric layer and the second dielectric layer;

a second ground part for electromagnetic shield provided on a second surface of the second dielectric plate; and one or more through hole(s), provided on the second dielectric layer and the third dielectric layer, for electrically connecting the first ground part for electromagnetic shield and the second ground part for electromagnetic shield.

5. The radio frequency power amplifier module according to the claim 1, wherein the transistors are heterojunction bipolar transistors of Gallium Arsenide compound semiconductor or field-effect transistors.

6. The radio frequency power amplifier module according to the claim 2, wherein the transistors are heterojunction bipolar transistors of Gallium Arsenide compound semiconductor or field-effect transistors.

7. The radio frequency power amplifier module according to the claim 4, wherein the transistors are heterojunction bipolar transistors of Gallium Arsenide compound semiconductor or field-effect transistors.

* * * * *